(12) United States Patent
Nomura et al.

(10) Patent No.: US 7,728,418 B2
(45) Date of Patent: Jun. 1, 2010

(54) SEMICONDUCTOR DEVICE AND MANUFACTURING METHOD THEREOF

(75) Inventors: Hiroshi Nomura, Kawasaki (JP);
Satoshi Otsuka, Kawasaki (JP);
Yoshihiro Takao, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 124 days.

(21) Appl. No.: 11/777,669

(22) Filed: Jul. 13, 2007

(65) Prior Publication Data
US 2008/0017965 A1 Jan. 24, 2008

(30) Foreign Application Priority Data
Jul. 18, 2006 (JP) ............... 2006-195054

(51) Int. Cl.
*H01L 23/02* (2006.01)

(52) U.S. Cl. ............... 257/685; 257/E21.598; 257/E23.002; 438/107

(58) Field of Classification Search ........ 257/685, 257/E21.598, E23.002; 438/107
See application file for complete search history.

(56) References Cited

U.S. PATENT DOCUMENTS 7,417,304 B2 * 8/2008 Tsutsue ............ 257/620

| | | | |
|---|---|---|---|
| 2003/0178706 A1 | 9/2003 | Eshima et al. | |
| 2004/0140501 A1 * | 7/2004 | Kim | 257/328 |
| 2005/0161794 A1 * | 7/2005 | Kato et al. | 257/686 |
| 2005/0275068 A1 * | 12/2005 | Brambilla et al. | 257/620 |
| 2006/0076651 A1 * | 4/2006 | Tsutsue | 257/620 |
| 2006/0115743 A1 * | 6/2006 | Yaegashi | 430/5 |
| 2007/0012976 A1 | 1/2007 | Yaegashi et al. | |

FOREIGN PATENT DOCUMENTS

| | | |
|---|---|---|
| CN | 1445837 A | 10/2003 |
| JP | 03-94462 A | 4/1991 |
| JP | 2002134506 A * | 5/2002 |
| JP | 2004-296843 A | 10/2004 |
| WO | 2005/117120 A1 | 12/2005 |

OTHER PUBLICATIONS

Translation of JP 2002134506 A.*
Chinese Office Action mailed Jun. 20, 2008, issued in corresponding Chinese Application No. 200710136626.5.

* cited by examiner

*Primary Examiner*—Thanh V Pham
*Assistant Examiner*—Marvin Payen
(74) *Attorney, Agent, or Firm*—Westerman, Hattori, Daniels & Adrian, LLP

(57) ABSTRACT

A semiconductor device includes a plurality of chips comprising a plurality of first moisture-proof rings individually surrounding said plurality of chips, a second moisture-proof ring surrounding the entire plurality of chips, and a wire for connecting said plurality of chips to each other.

5 Claims, 16 Drawing Sheets

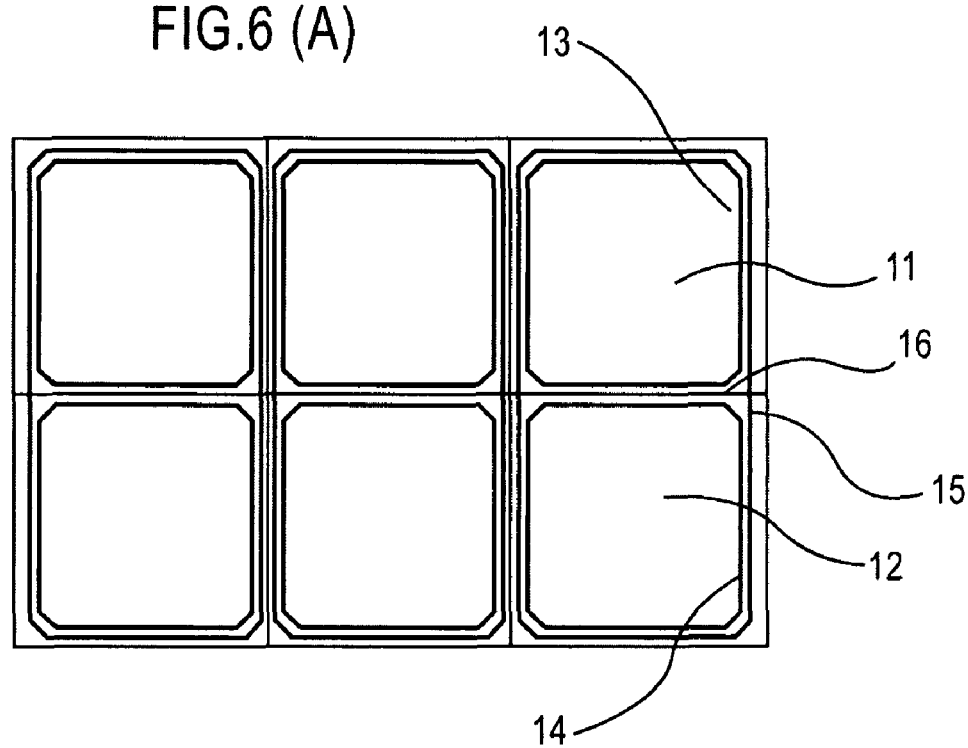
FIG.6 (A)
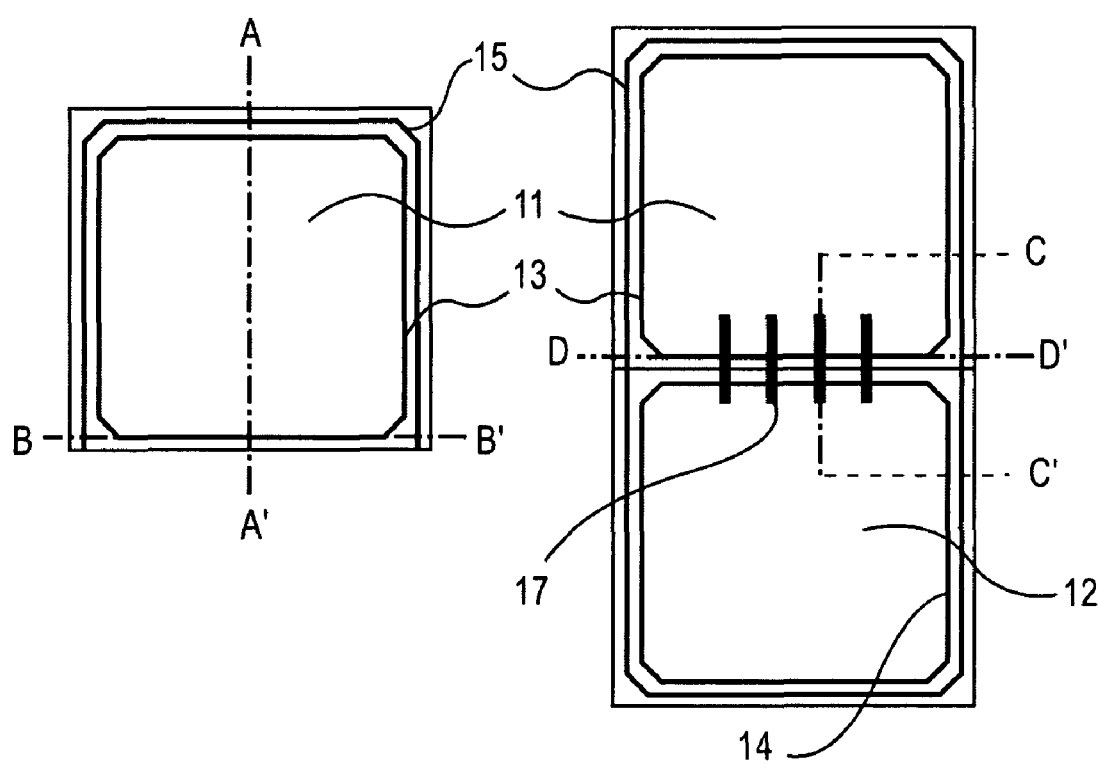
FIG.6 (B)
FIG.6 (C)

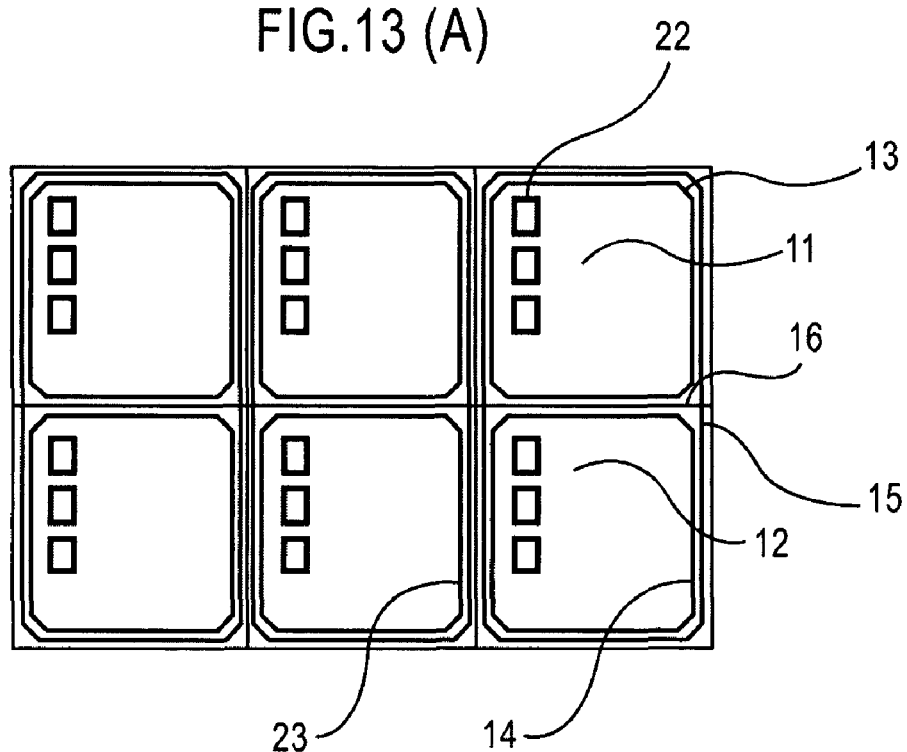
FIG.13 (A)
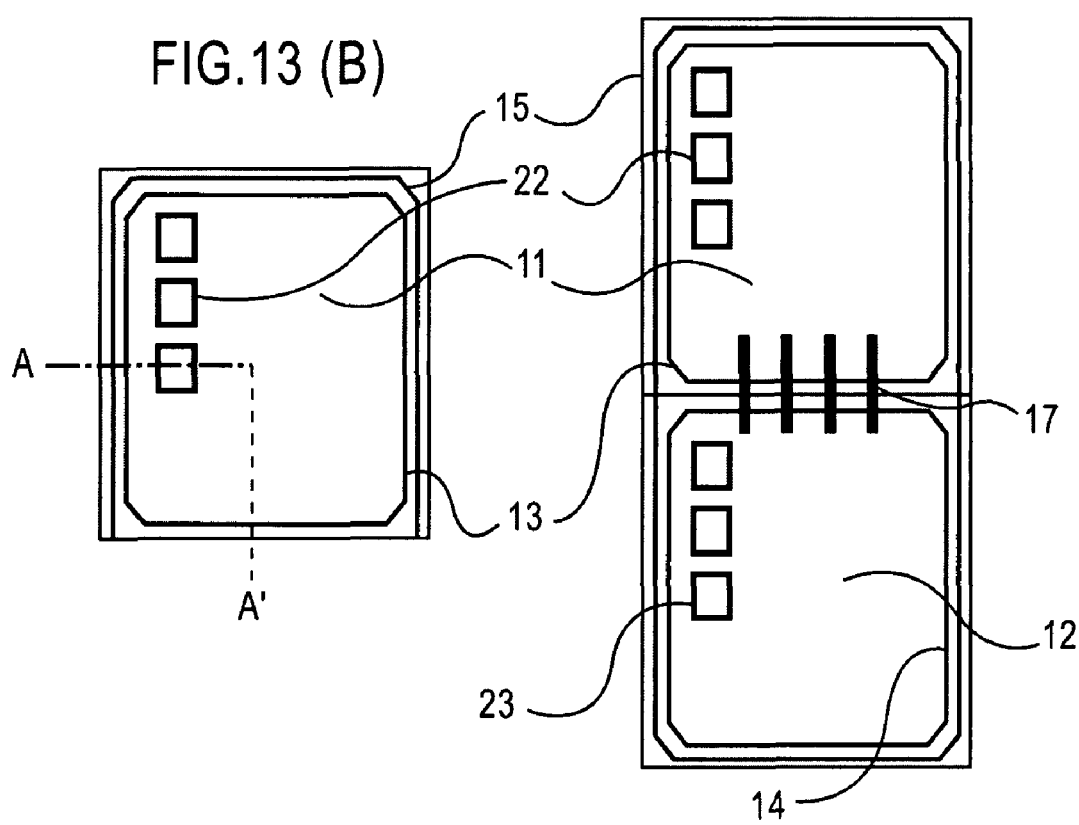
FIG.13 (B)
FIG.13 (C)

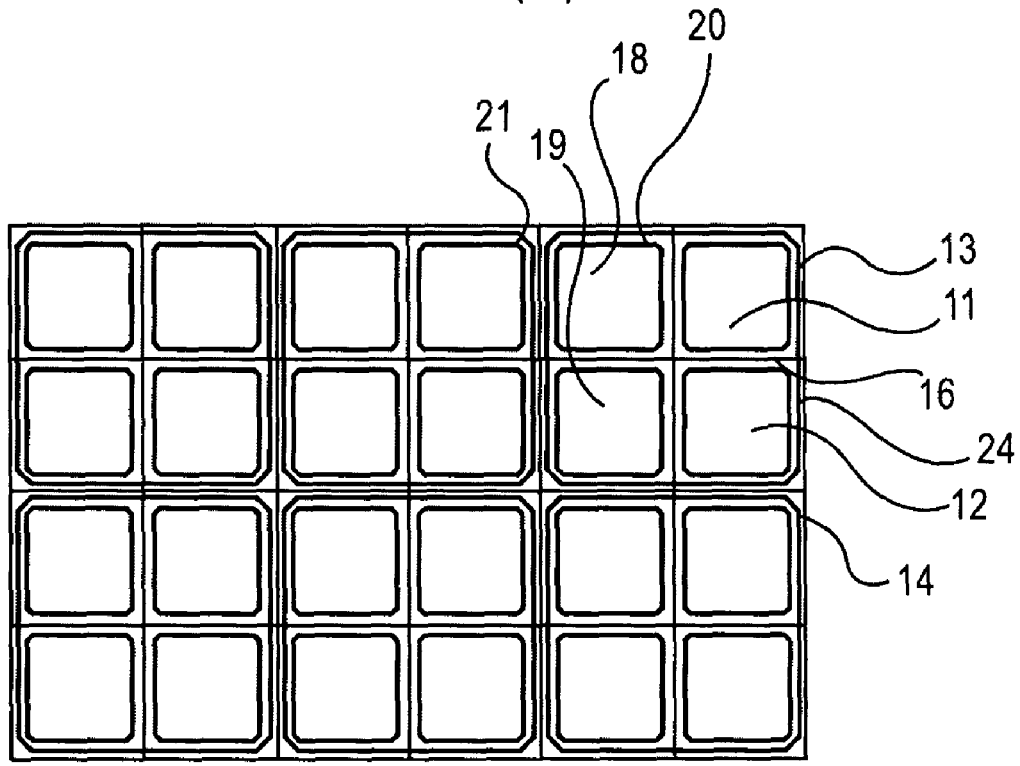
FIG.16 (A)
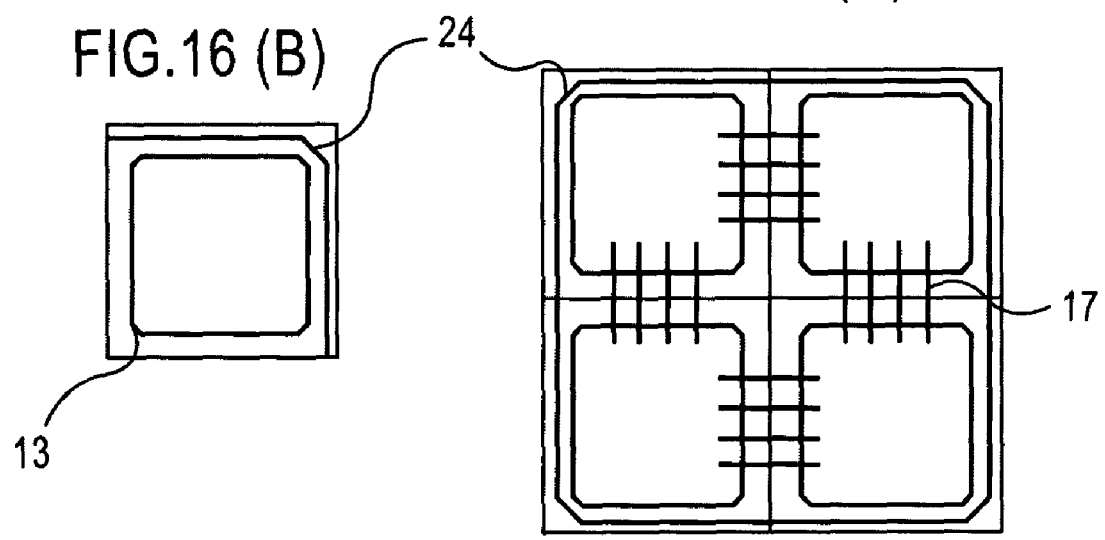
FIG.16 (B)
FIG.16 (C)

US 7,728,418 B2

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2006-195054, filed on Jul. 18, 2006, the entire contents of that are incorporated herein by reference.

FIELD OF THE INVENTION

The present invention relates to a semiconductor device comprising a moisture-proof ring for preventing invasion of moisture into a chip and a manufacturing method of the semiconductor device.

BACKGROUND OF THE INVENTION

FIG. 1 is a cross-sectional view of a semiconductor device. As shown in FIG. 1, the semiconductor device comprises active elements such as a MOS transistor 2, a wiring layer 3 formed of a conductor, a plug 5, and interlayer insulting film 4 formed on a semiconductor wafer 1.

FIG. 2 is a plan view showing the condition where a plurality of integrated circuits 6 having an identical circuit pattern (hereinafter referred to as chip) are formed on a single wafer 1. Such a wafer 1 is diced along the scribe line 7 provided between the chips 6 to thereby separate them into individual chips. At the side wall surface of each chip 6 separated by the dicing process, a cross-section of the interlayer insulating film 4, such as is shown in FIG. 1 is exposed. The interlayer insulating film 4 such as silicon oxide has the nature to absorb moisture from the atmosphere. If moisture from the external atmosphere enters the inside from the side wall surface of the chip 6, the problem arise that a wiring layer 3 and a plug formed of conductor are corroded and characteristics of the integrated circuit are thereby deteriorated.

The technology to surround the external circumference of chip 6 with a moisture-proof ring is known. Such a moisture-proof ring is continuously formed along the external circumference of the individual chips 6 in order to shield the path from which the moisture content may enter into the chip 6.

FIG. 3 is a partly enlarged plan view of a plurality of chips formed on a wafer. Each chip 6 comprises elements such as a MOS transistor, a region where an internal circuit 8 having a wiring layer is formed, and a moisture-proof ring 9 formed surrounding the internal circuit 8. A scribe line 7 is provided between chips 6.

FIG. 4 is a cross-sectional view along the line A-A' in FIG. 3. On the surface of wafer 1 in the internal circuit 8 region, a MOS transistor 2 is formed. Also, in the region of the internal circuit 8, a multilayer wiring structure including the wiring layers L1 to L6 connected to the MOS transistor 2 and the plugs P1 to P6 connecting the wiring layers is formed. Between the wiring layers, the interlayer insulating layers D1 to D8 are formed. On the interlayer insulating film D8, a passivation film 20 is formed.

The moisture-proof ring 9 is constituted with a laminated layer of the moisture-proof ring conductor patterns LS1 to LS6 formed of a conductive layer identical to that of the wiring layers L1 to L6 and the moisture-proof ring conductor patterns PS1 to PS6.

The moisture-proof ring 9 has a layer structure identical to that of the multilayer wiring structure of the internal circuit 8 and may also be formed simultaneously with the internal circuit 8 using common processes in the art. In many cases, the moisture-proof ring is fixed to a predetermined potential such as ground potential.

Research has been conducted into a device constituted by joining a plurality of chips with wires on the wafer, in place of separating chips with the dicing process, utilizing a semiconductor process where a plurality of identical chips are formed.

FIGS. 5(A) and 5(B) are explanatory diagrams of the method to connect a plurality of chips by wires on a wafer. FIG. 5(A) is a reticle for manufacturing devices where every chip is to be individually diced. The reticle 10a includes the region where an internal circuit pattern 8 is formed and the region of a scribe line 7. A plurality of chips having an identical circuit pattern are formed on the wafer using the reticle 10a. The scribe line 7 is formed between the chips and each chip is separated by the dicing process.

FIG. 5(B) is a reticle for manufacturing a single device by connecting the adjacent chips with wires on the wafer. The structure of the internal circuit 8 is identical to that of the internal circuit 8 of the reticle shown in FIG. 5(A). In the region 8c provided at a part of the scribe line 7, the connecting wire is formed to connect the adjacent chips. The chip-to-chip connecting wires are formed simultaneously with the wiring of the internal circuit 8 by utilizing reticle 10b. In this case, the dicing is not performed along the scribe line 7 between chips.

In this specification, a device constituted by individually separating the chips is called a single-core device, while a device constituted by separating the chips in units comprising a plurality of chips is called a multi-core device.

In the course of business, a manufacturer of semiconductor devices is requested to manufacture single-core devices or multi-core devices in accordance with requirements from users. It is desirable for manufacturers to prepare reticle sets required in order to realize manufacture and supply of reticles within a short period of time even in the case where a single-core or multi-core device request maybe issued.

For manufacture of a single-core device, it is required to prepare a set of reticles including a moisture-proof ring pattern surrounding each chip. For example, in the case of a device having six-layers of wiring, about 15 reticles are required for the wiring process. Modifications are required for the structure of the moisture-proof ring of a multi-core device and a set of reticles which are different from those used for the single-core device must be prepared. About 15 reticles required for the wiring must be additionally prepared.

As such, a set of reticles required for manufacturing both the single-core device and the multi-core device are about 30 reticles in total, and the cost required for preparation of these reticles becomes very expensive.

SUMMARY

In accordance with one aspect of the invention, a semiconductor device includes a plurality of chips comprising a plurality of first moisture-proof rings individually surrounding said plurality of chips, a second moisture-proof ring surrounding the entire plurality of chips, and a wire for connecting said plurality of chips to each other.

BRIEF DESCRIPTION OF THE DRAWINGS

FIG. 6(A)-(C) are diagrams showing profiles of the layout of the moisture-proof ring in the first embodiment of the present invention.

FIG. 13(A)-(C) are diagrams showing the second embodiment of the present invention.

FIG. 16(A)-(C) are diagrams showing the fourth embodiment of the present invention.

DETAILED DESCRIPTION OF THE INVENTION

First Embodiment

Figure 1:
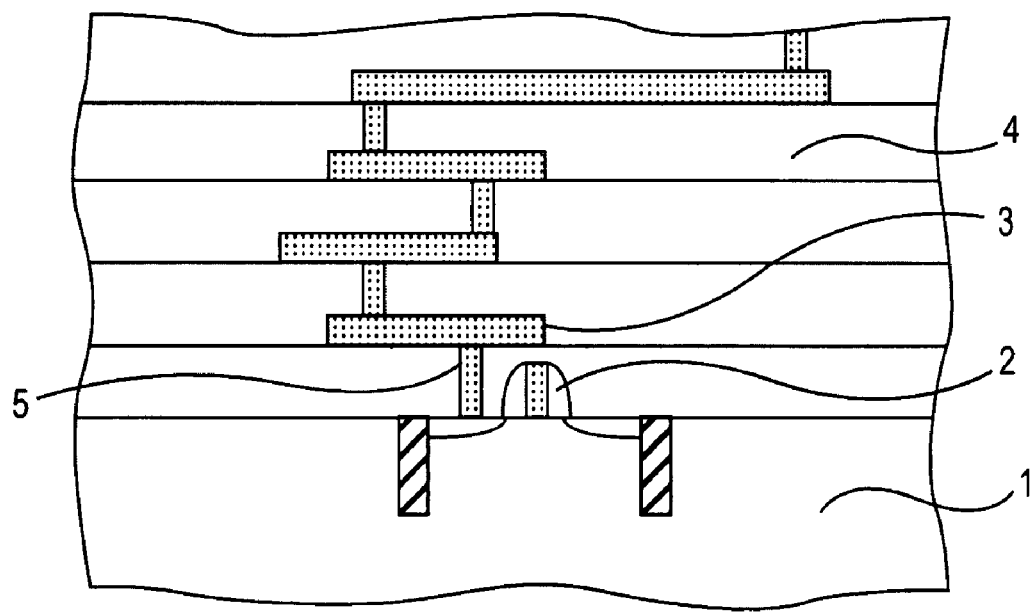
FIG. 1 is a cross-sectional view of a conventional semiconductor device in related art.
Figure 2:
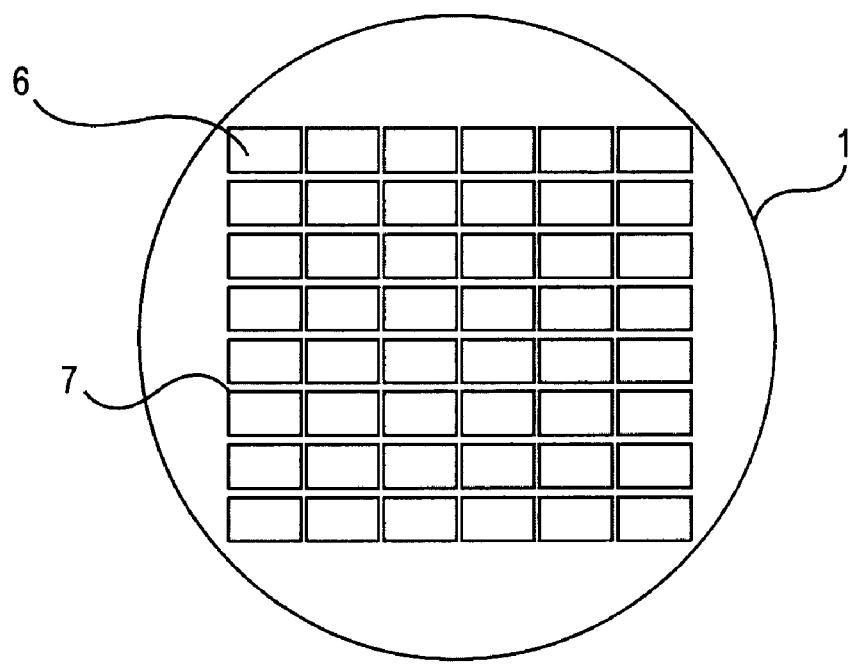
FIG. 2 is a plan view showing a state where pluralities of integrated circuits including an identical circuit pattern are formed on a wafer.
Figure 3:
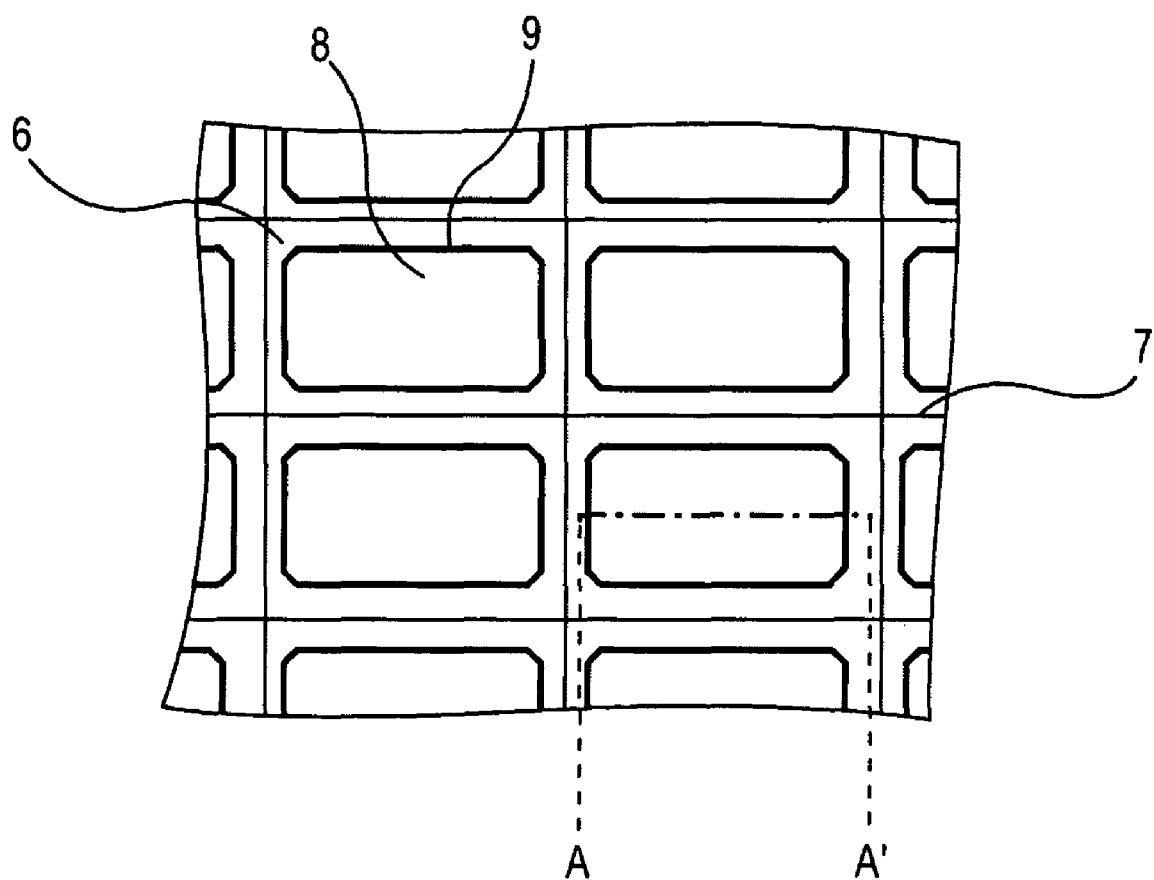
FIG. 3 is a plan view showing an enlarged part of a plurality of chips formed on a wafer.
Figure 4:
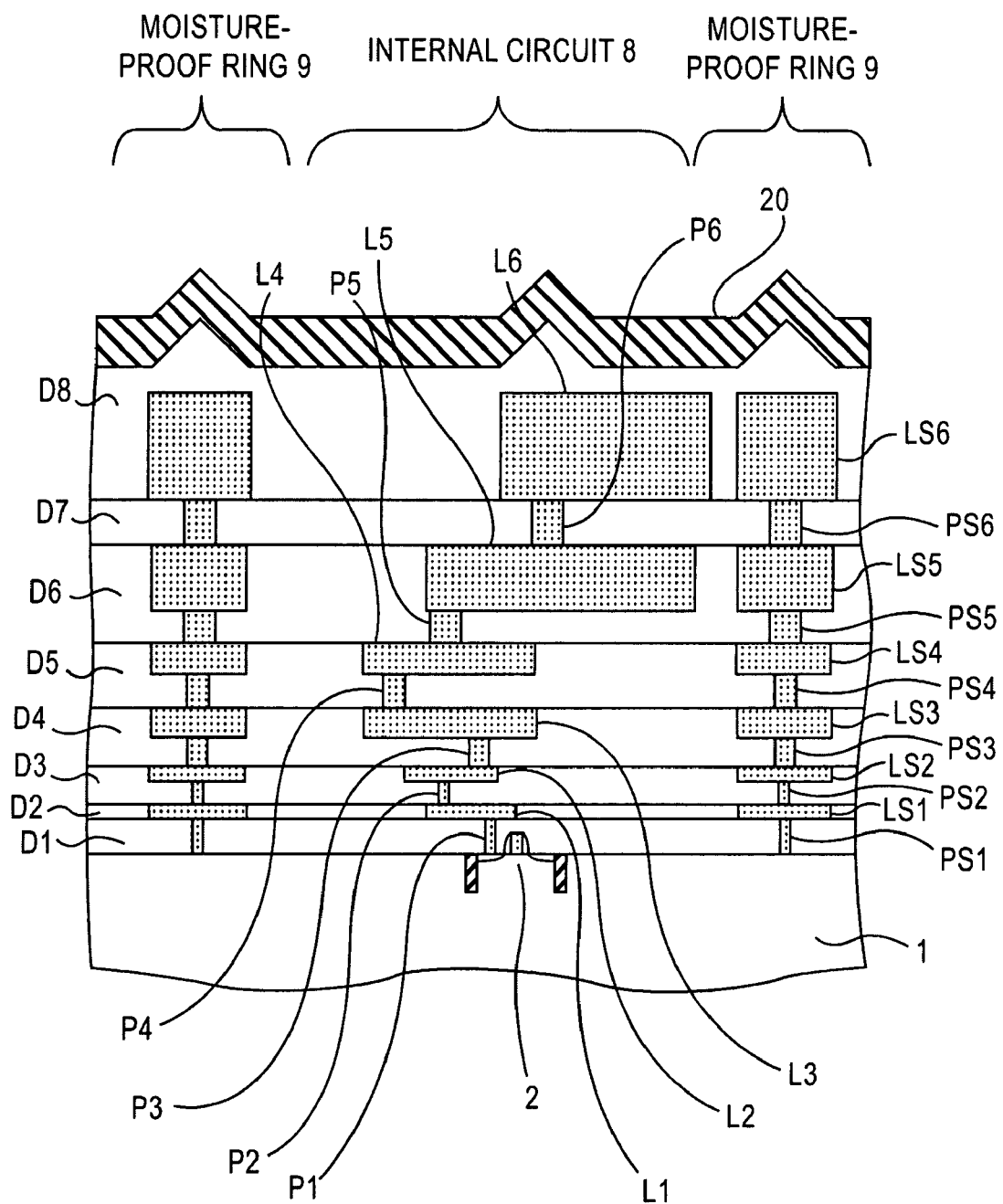
FIG. 4 is a cross-sectional view along the line A-A' in FIG. 3.
Figure 5:
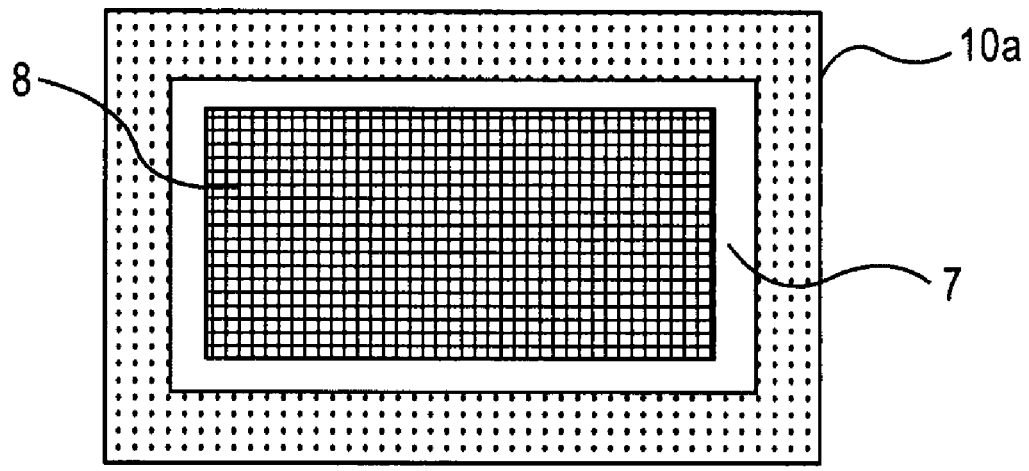
FIGS. 5(A) and (B) are diagrams showing reticles for use in a method for forming single-core devices and for connecting a plurality of chips with wires on the wafer for forming multi-core devices.
Figure 5:
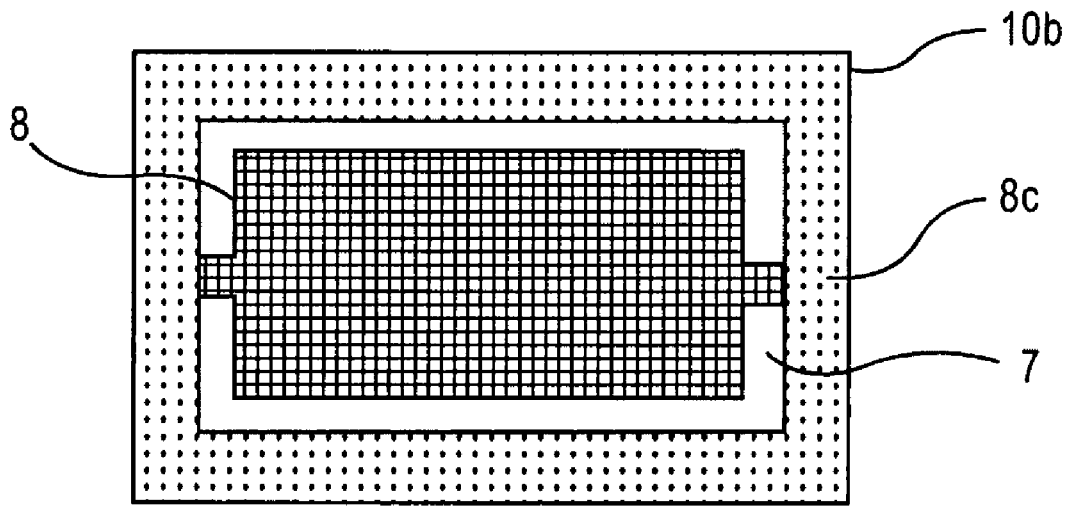
Figure 7:
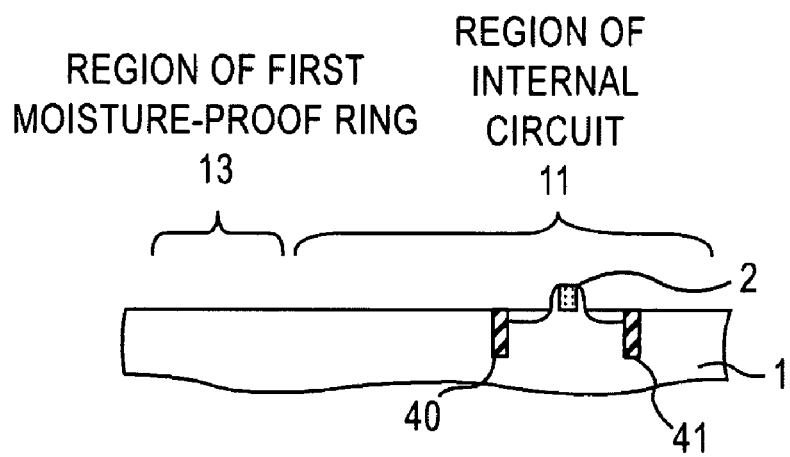
FIG. 7(A)-(E) are processing diagrams showing cross-sectional views along the line A-A' in FIG. 6(B).
Figure 7:
Figure 7:
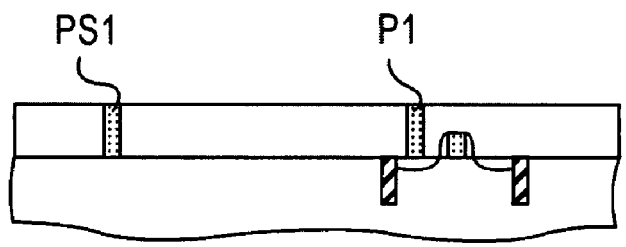
Figure 7:
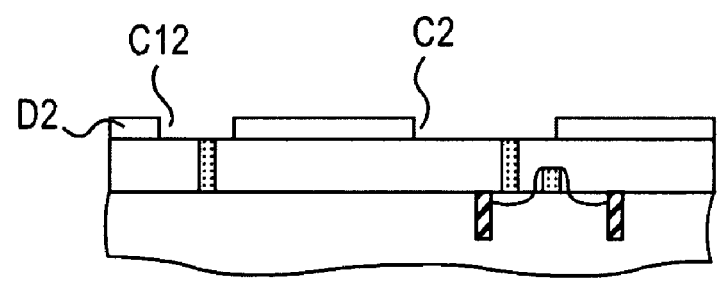
Figure 7:
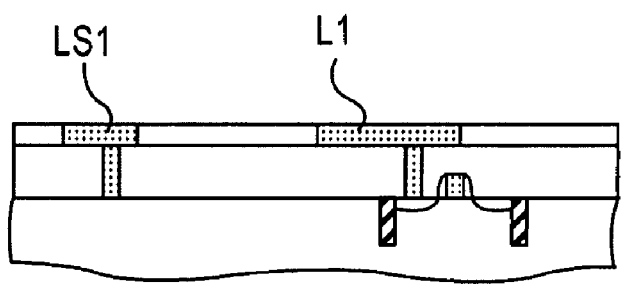

In manufacture of a single-core device, dicing is conducted along the scribe line between the first internal circuit and the second internal circuit. A first moisture-proof ring and second moisture-proof ring are respectively formed continuously surrounding the first internal circuit and the second internal circuit.

In manufacture of a multi-core device, a first aperture is provided to a part of the first moisture-proof ring and a second aperture is provided to a part of the second moisture-proof ring and connecting wires for connecting the first and second internal circuits are formed through the first and second apertures. The first internal circuit and the second internal circuit constitute the multi-core device without disconnection and separation along the scribe line allocated between the first internal circuit and the second internal circuit. A third moisture-proof ring is continuously surrounding the first internal circuit, second internal circuit, and connecting wires.

In the case of manufacturing a single-core device, the first moisture-proof ring surrounds the first internal circuit and the second moisture-proof ring surrounds the second internal circuit to prevent invasion of moisture. Moreover, in the case of manufacturing a multi-core device, the third moisture-proof ring surrounds the first internal circuit, second internal circuit, and connecting wires to prevent invasion of moisture. By using this layout of moisture-proof rings, both a single-core device and a multi-core device can be manufactured from a set of fewer reticles than that used in the related art.

FIGS. 6(A) to 6(C) are diagrams showing layouts of the moisture-proof ring. FIG. 6(A) shows a plurality of chips having an identical circuit structure included within one shot. One shot means a region on the wafer irradiated with single exposure in the case of exposing the reticles on the wafer which are moved by a stepper. In this embodiment, two adjacent chips are used to manufacture a multi-core devices.

Referring to FIG. 6(A), there is provided a first internal circuit 11, a first moisture-proof ring 13 provided surrounding a region of the first internal circuit 11, a second internal circuit 12 adjacent to the first internal circuit 11, a second moisture-proof ring 14 provided surrounding a region of the second internal circuit 12, a scribe line 16 provided between the first moisture-proof ring 13 and the second moisture-proof ring 14, and a third moisture-proof ring 15 surrounding the first moisture-proof ring 13, second moisture-proof ring 14 and scribe line 16.

FIG. 6(B) shows a single-core device manufactured using the moisture-proof ring layout. FIG. 6(C) shows a multi-core device manufactured using the moisture-proof ring layout.

In the single-core device, the first moisture-proof ring 13 is formed continuously surrounding the first internal circuit 11 to obtain sufficient moisture-proof characteristics to protect the first internal circuit. Similarly, the second moisture-proof ring 14 is formed continuously surrounding the second internal circuit 12.

In the case of manufacturing a multi-core device, the first internal circuit 11 and the second internal circuit 12 are connected with a connecting wire 17. The third moisture-proof ring 15 is formed continuously surrounding the first internal circuit 11, second internal circuit 12 and connecting wire 17 to obtain sufficient moisture-proof characteristics. This multi-core device may be manufactured, as will be explained later, only by modifying a part of a plurality of reticles used for manufacturing the single-core device.

FIGS. 7(A) to 7(E) are cross-sectional diagrams along the line A-A' of FIG. 6(B). Processes for manufacturing a single-core device will be explained.

The line A-A' in FIG. 6(B) crosses the region of internal circuit 11, the first moisture-proof ring 13 at two points, and the third moisture-proof ring 15 at one point. However, in FIGS. 7(A) to 7(E), explanation will be made referring to only the cross-sections at one point of the first moisture-proof ring 13 and the region of the internal circuit 11.

In FIG. 7(A), element isolating regions 40, 41 are formed, for example, with the STI (Shallow Trench Isolation) method in the region where the internal circuit 11 of the wafer 1 is formed. In an active region defined with the element isolating regions 40, 41, a MOS transistor 2 in the gate length of 30 nm, for example, is formed. Moreover, in the region of the internal circuit 11, a multilayer wiring structure including a wiring layer connected to the MOS transistor 2 and a plug is formed.

In FIG. 7(B) an insulating film D1 is deposited over the entire surface of the wafer 1, for example, with the CVD (Chemical Vapor Deposition) method. As this insulating film D1, a silicon oxide film, a low dielectric constant film such as SiOF film, or SiOC film can be used. Next, a contact hole C1 to form a plug is formed to the insulating film D1. The insulating film D1 is selectively removed, for example, with the dry-etching method and a contact hole C1 in diameter of 50 nm is also formed to expose an electrode of the MOS transistor 2.

With the same etching process, a groove C11 for a moisture-proof ring is formed in the insulating film 11 in the periphery of the chip. Width of the groove C11 for the moisture-proof ring is desirably set in the same degree as the diameter of the contact hole C1.

In FIG. 7(C), a conductive layer is deposited within the contact hole C1 to form the plug and the groove C11 for the moisture-proof ring and on the insulating film D1. Thereafter, the conductive layer for plug P1 deposited on the insulating film D1 is removed, for example, with the CMP (Chemical Mechanical Polishing) method. With this process, the plug P1 is formed within the contact hole C1. Simultaneously, the moisture-proof ring conductive pattern PS1 is formed within the groove C11. As the conductive layer, tungsten, aluminum, and copper may be used. Moreover, as the film forming method, the CVD method and sputtering method or the like can be used.

A wiring layer L1 and a moisture-proof ring conductor pattern LS1 are formed on the insulating film D1. As the wiring layer L1 and conductive layer for moisture-proof ring conductor pattern LS1, aluminum and copper may be used. In the case where copper is used as the conductive layer, a wiring layer is formed with the damascene method.

In FIG. 7(D), an insulating film D2 is deposited first on the entire surface. As the insulating film D2, a low dielectric constant film such as silicon oxide film, SiOF film, and SiOC film can be used as in the case of the underlying insulating film D1. Thereafter, a wiring groove C2 and a moisture-proof ring groove C12 are formed with an etching process.

In FIG. 7(E), a conductive film is deposited within the wiring groove C2, moisture-proof ring groove C12 and on the insulating film D2. Thereafter, the conductive material on the insulating film D2 is removed with the CMP method and a wiring layer L1 formed of copper is formed within the wiring groove C2. Simultaneously, a moisture-proof conductive pattern LS1 is formed in the moisture-proof ring groove C12.

Similar processes are repeated to form an internal circuit 11 having a multilayer wiring structure and a first moisture-proof ring 13. With the same process, a third moisture-proof ring 15 is also formed, although it is not illustrated in FIGS. 7(A) to 7(E). For the wiring layer forming process, the so-called dual-damascene method to form the wiring layer and plug with a simultaneous CMP process may also be employed.

Figure 8:
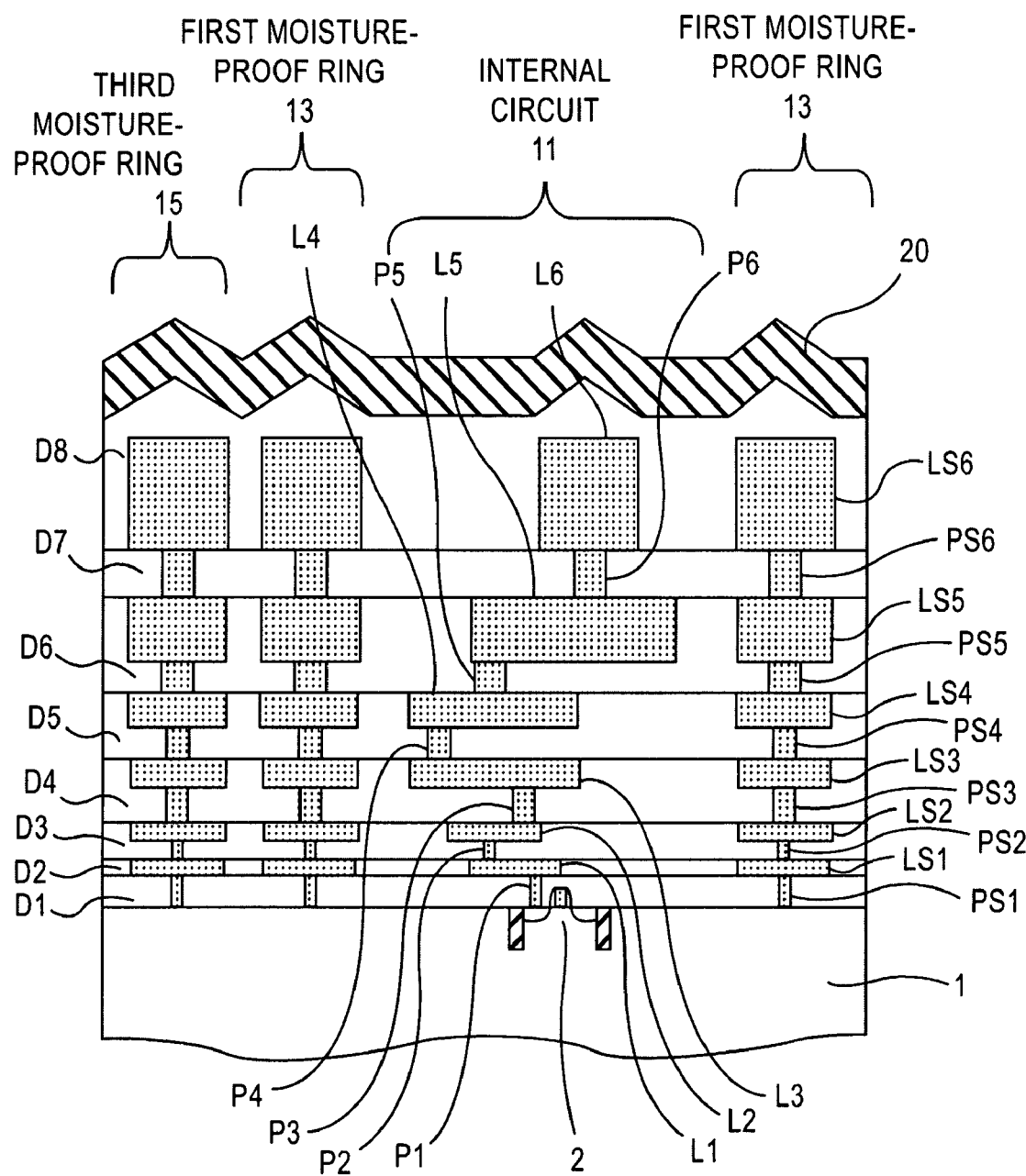
FIG. 8 is a cross-sectional view along the line A-A' in FIG. 6(B).

FIG. 8 is a cross-sectional view along the line A-A' in FIG. 6(B). As explained above, the first moisture-proof ring 13 and the third moisture-proof ring 15 have the same layer structure as the multilayer wiring structure of the internal circuit 11 and are formed simultaneously with the same process for formation of the internal circuit 11. On an insulating film D8, a passivation film 20 is formed to prevent invasion of moisture from the upper surface of chip. As the passivation film 20, a $Si_3N_4$ film or the like may be used.

Figure 9:
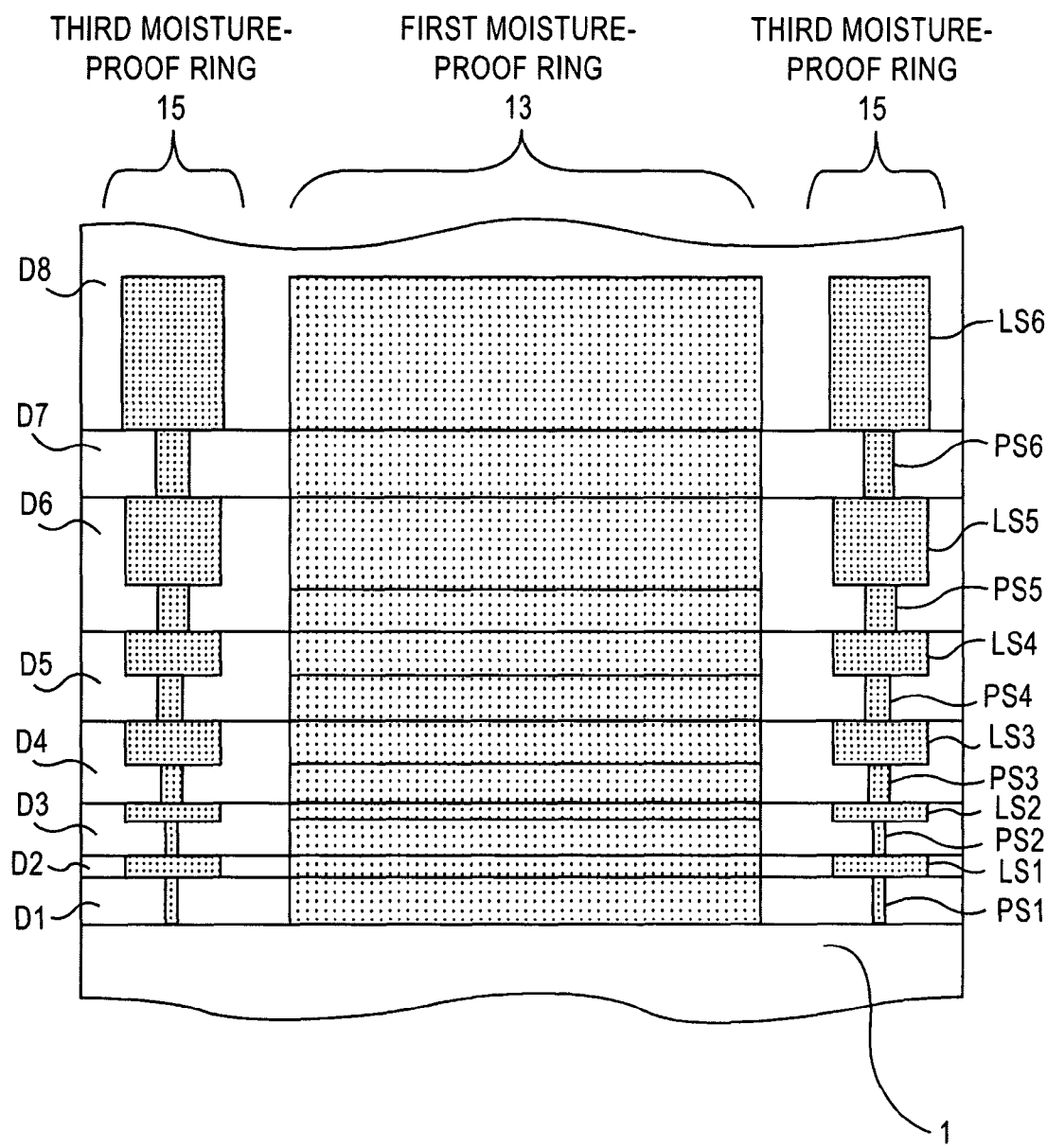
FIG. 9 is a cross-sectional view along the line B-B' in FIG. 6(B).

FIG. 9 is a cross-sectional view along the line B-B' in FIG. 6(B). The first moisture-proof ring 13 and the third moisture-proof ring 15 are constituted with the moisture-proof ring conductor patterns LS1 to LS6 formed of the same conductor layer as the wiring layers L1 to L6 of the internal circuit 11, and the moisture-proof ring conductor patterns PS1 to PS6 formed of the same conductor layer as the plugs P1 to P6.

In FIG. 6(B), the third moisture-proof ring 15 is separated with the dicing process, so as not to form a closed loop. However, moisture-proof characteristics protecting the first internal circuit 11 are maintained by the first moisture-proof ring 13 formed continuously surrounding the first internal circuit 11.

A multi-core device manufactured utilizing the moisture-proof ring layout will be explained below.

Figure 10:
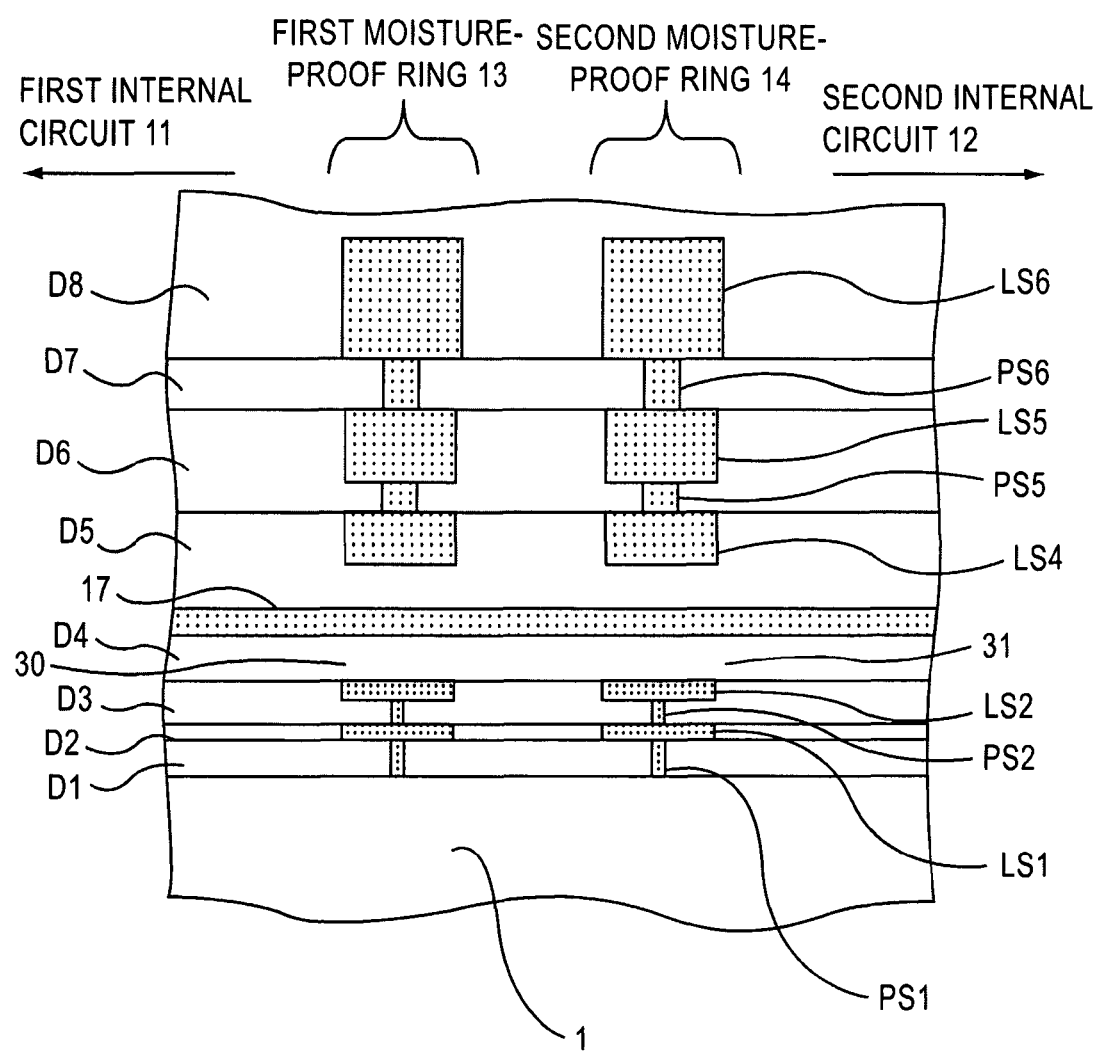
FIG. 10 is a cross-sectional view along the line C-C' in FIG. 6(C).

FIG. 10 is a cross-sectional view along the line C-C' in FIG. 6(C). In this figure, the like reference numerals in FIG. 7 and FIG. 8 denote the like elements and the same explanation is not repeated here.

FIG. 10 depicts the first moisture-proof ring 13 and the second moisture-proof ring 14 formed of the same plug and the conductive layers materials as the wiring layers (PS1 to PS6 and LS1 to LS6) for the internal circuits. The first moisture-proof ring 13 and the second moisture-proof ring 14 are formed simultaneously with the process to form the plugs P1 to P6 and wiring layers L1 to L6 of the first internal circuit 11 and the second internal circuit 12 as in the case of FIG. 7 and FIG. 8.

The difference between the manufacturing process of single-core device and that of the multi-core device is that the PS3 layer, LS3 layer and PS4 layer are not formed in the region where the connecting wire 17 is formed among the moisture-proof ring regions for the multi-core device connection.

A first aperture 30 is formed in a part of the conductor layer wall forming the first moisture-proof ring 13. A second aperture 31 is also formed in a part of the opposing second moisture-proof ring 14.

The connecting wire 17 for connecting the first internal circuit 11 and the second internal circuit 12 is formed passing through the first aperture 30 formed in the first moisture-proof ring 13 and the second aperture 31 formed in the second moisture-proof ring 14. The connecting wire 17 is formed using the conductive layer corresponding to the wiring layer L3.

In this embodiment, an aperture of the moisture-proof ring is formed in the PS3 layer, LS3 layer, and PS4 layer and the connecting wire is formed using the L3 layer. It is not essential that which layer should be used to form the aperture and connecting wire. Accordingly, these elements may be formed from any single layer or with a plurality of any layers. In addition, the total number of wiring layers is not restricted with the number of wiring layers used in this embodiment.

Figure 11:
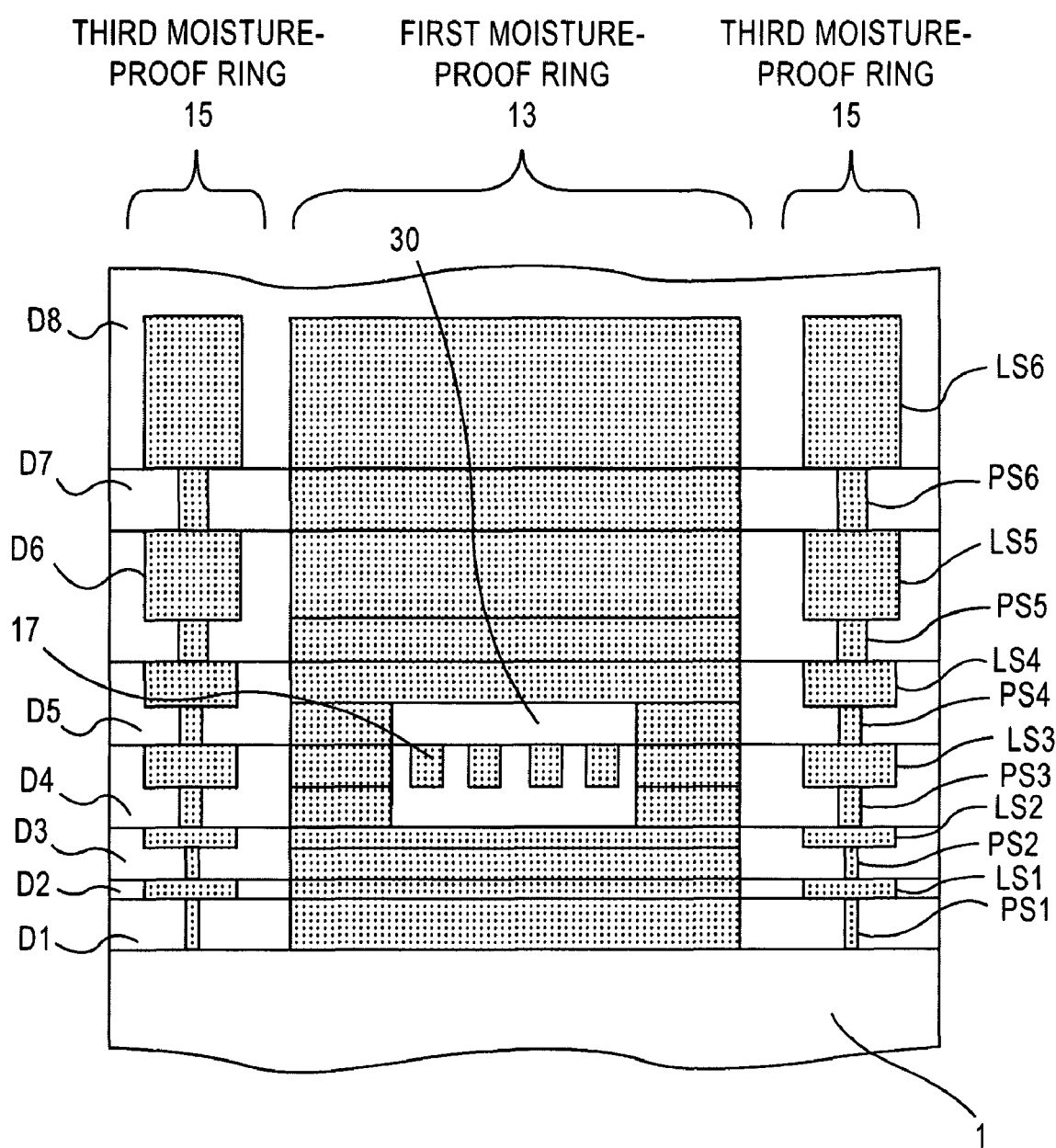
FIG. 11 is a cross-sectional view along the line D-D' in FIG. 6(C).

FIG. 11 is a cross-sectional view along the line D-D' in FIG. 6(C). A conductor wall is formed of the moisture-proof ring conductor patterns PS1 to PS6 and LS1 to LS6 constituted from the same conductor layers as the plugs P1 to P6 and wiring layers L1 to L6. Moreover, the first aperture 30 is formed in this conductor wall and the connecting wire 17 passing through the first aperture is also formed.

In FIG. 10 and FIG. 11, since the first aperture 30 and the second aperture 31 are formed respectively in the first moisture-proof ring 13 and the second moisture-proof ring 14, these rings are insufficient to assure moisture-proof characteristics to protect the first internal circuit 11 and the second internal circuit 12. Moreover, since the connecting wire 17 is also formed in the external side of the first moisture-proof ring 13 and the second moisture-proof ring 14, it is impossible to assure moisture-proof protection from the first moisture-proof ring 13 or the second moisture-proof ring 14.

As shown in FIG. 6(C), since the third moisture-proof ring 15 is formed continuously surrounding the first moisture-proof ring 13, moisture-proof ring 14 and connecting wire 17, moisture-proof protection of these circuits is ensured.

In the multi-core device, it is required to respectively provide the first aperture 30 and the second aperture 31 to the first moisture-proof ring 13 and the second moisture-proof ring 14. Therefore, reticles with differences in the pattern from that of the single-core device must be prepared for the PS3 layer, LS3 layer and PS4 layer among the moisture-proof ring conductor patterns. The pattern is identical to that of the single-core device for the moisture-proof ring conductor patterns PS1, LS1, PS2, LS2, LS4, PS5, LS5, PS6, and LS6, and these layers can be manufactured using the reticles for the single-core device.

When a set of reticles required for manufacture the single-core device is already prepared, the multi-core device can be manufactured only by newly creating three reticles corresponding to the PS3 layer, LS3 layer, and PS4 layer.

FIG. 6 shows a profile wherein the corners of the moisture-proof rings 13, 14, and 15 are chamfered, in order to avoid centering of stress to the corners of moisture-proof rings and to raise accuracy of size in the photolithography process and etching process. However, it is a matter of course that the present invention can also be used, even when the corners of the moisture-proof rings are formed in the shape of right angles.

Figure 12:
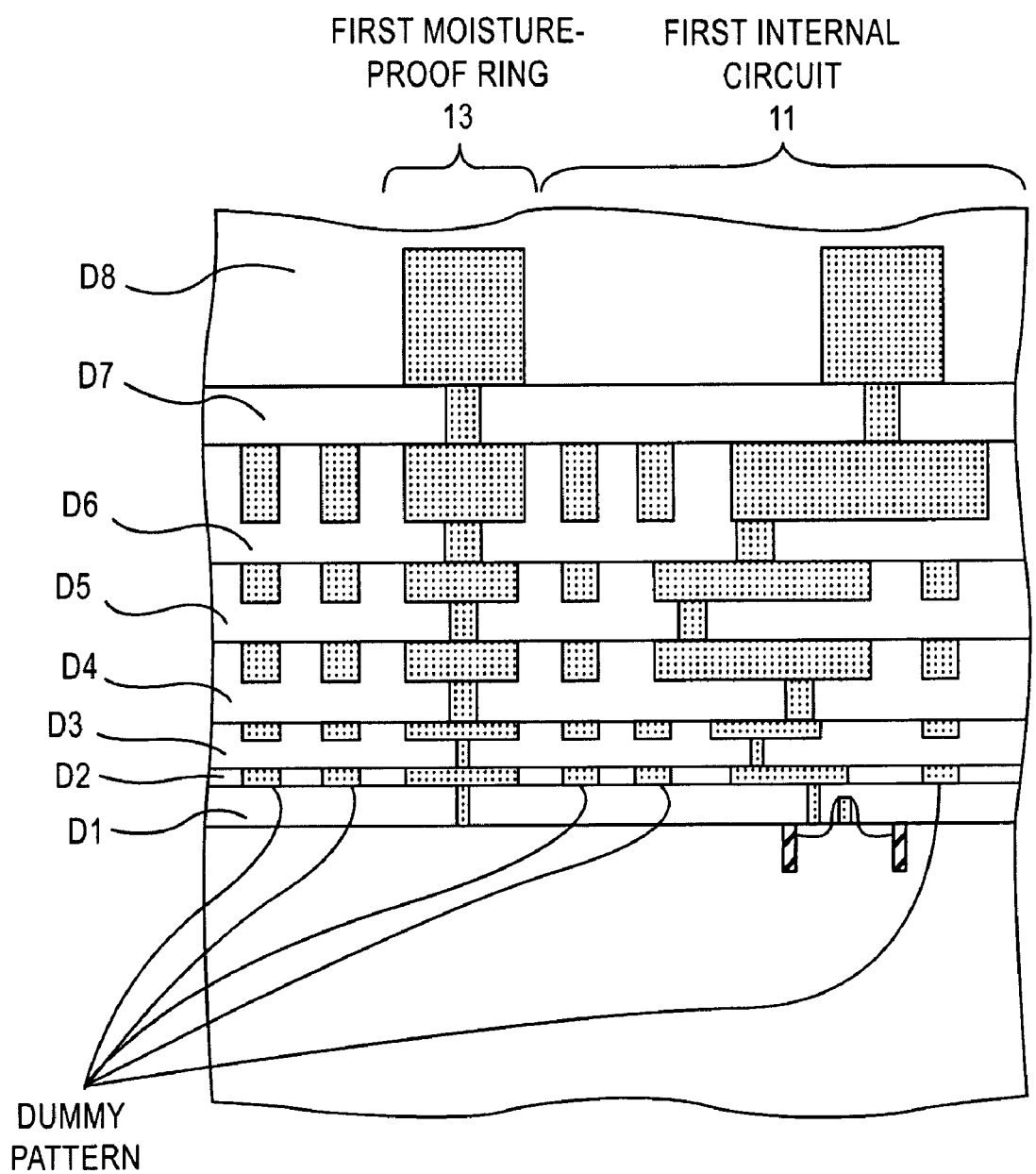
FIG. 12 is a diagram showing a dummy pattern of a wiring layer.

FIG. 12 is a diagram showing a dummy pattern of a wiring layer. In this case, flatness in the damascene process can be enhanced by allocating a dummy pattern of copper wire to the region where an internal circuit and a moisture-proof ring pattern do not exist and by equalizing density of the wiring patterns. This technique may be incorporated with the present invention.

Second Embodiment

FIG. 13 is a diagram showing a second embodiment of the present invention. In this figure, the same reference numerals as those in the first embodiment denote similar elements to avoid duplicate explanation thereof. According to the layout diagram of FIG. 13, the first internal circuit 11, the second internal circuit 12 and the first moisture-proof ring 13 and the second moisture-proof ring 14 surrounding respective internal circuits are formed similar to the first embodiment. The scribe line 16 is provided between the first moisture-proof ring 13 and the second moisture-proof ring 14 and the third moisture-proof ring 15 is also formed surrounding the first internal circuit 11, second internal circuit 12 and scribe line 16.

A first pad group 22 connected to the first internal circuit 11 is allocated within the first moisture-proof ring 13. In the same manner, a second pad group 23 connected to the second internal circuit 12 is allocated within the second moisture-proof ring 14. These pad groups are not allocated in the region outside the first moisture-proof ring 13 and the second moisture-proof ring 14.

Figure 14:
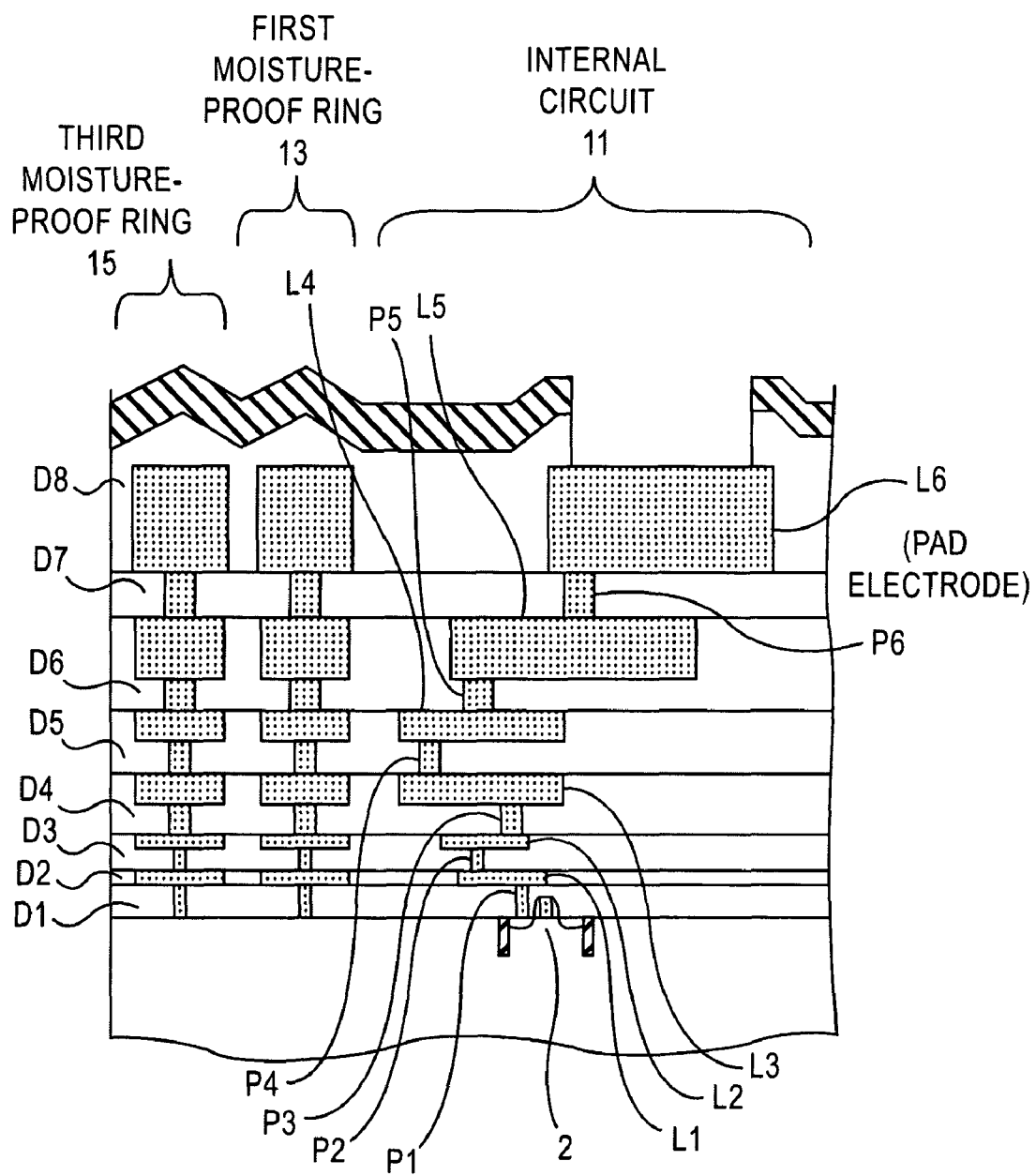
FIG. 14 is a cross-sectional view along the line A-A' in FIG. 13(B).

FIG. 14 is a cross-sectional view along the line A-A' in FIG. 13(B). A pad electrode is formed under the aperture formed in the passivation film 20. The pad electrode is formed of a wiring layer L6 of the first internal circuit 11.

In the case of manufacture of the single-core device, the pad electrode of the first pad group 22 is located in the region surrounded by the first moisture-proof ring 13. Moisture entering from the side wall of the chip is shielded with the first moisture-proof ring 13. Moreover, moisture entering from the upper part of the chip is almost shielded with the passivation film 20 and the L6 layer as the pad electrode. The surface of pad electrode is sometimes corroded a little with moisture from the atmosphere, but since the L6 layer as the conductive layer shields moisture, moisture does not enter the underlayer of the wiring layer and the peripheral area of the MOS transistor.

In the case of manufacture of the multi-core device, moisture entering from the side wall of chip is shielded with the third moisture-proof ring 15 as shown in FIG. 13(C). Moisture entering from the upper part of chip is almost shielded with the passivation film 20 and the L6 layer as the pad electrode.

Third Embodiment

Figure 15:
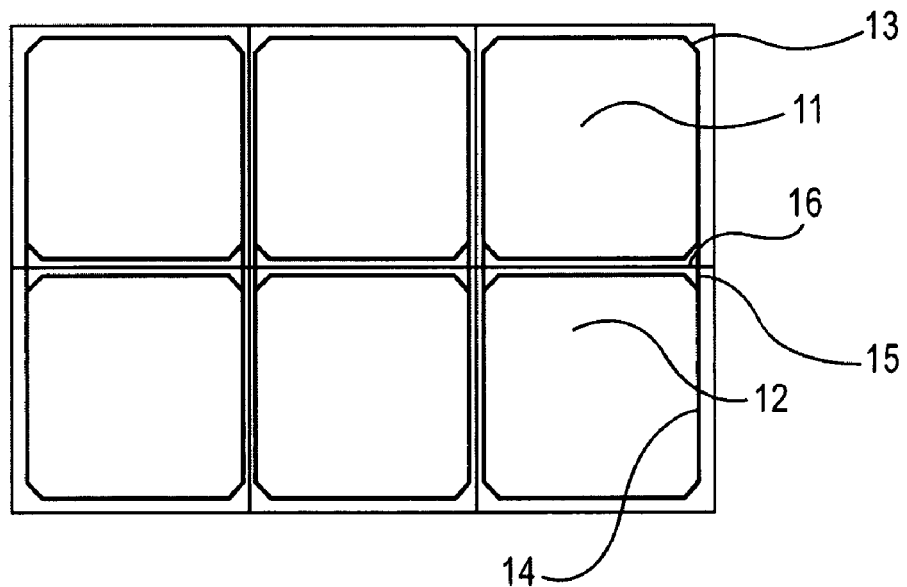
FIG. 15(A)-(C) are diagrams showing the third embodiment of the present invention.
Figure 15:
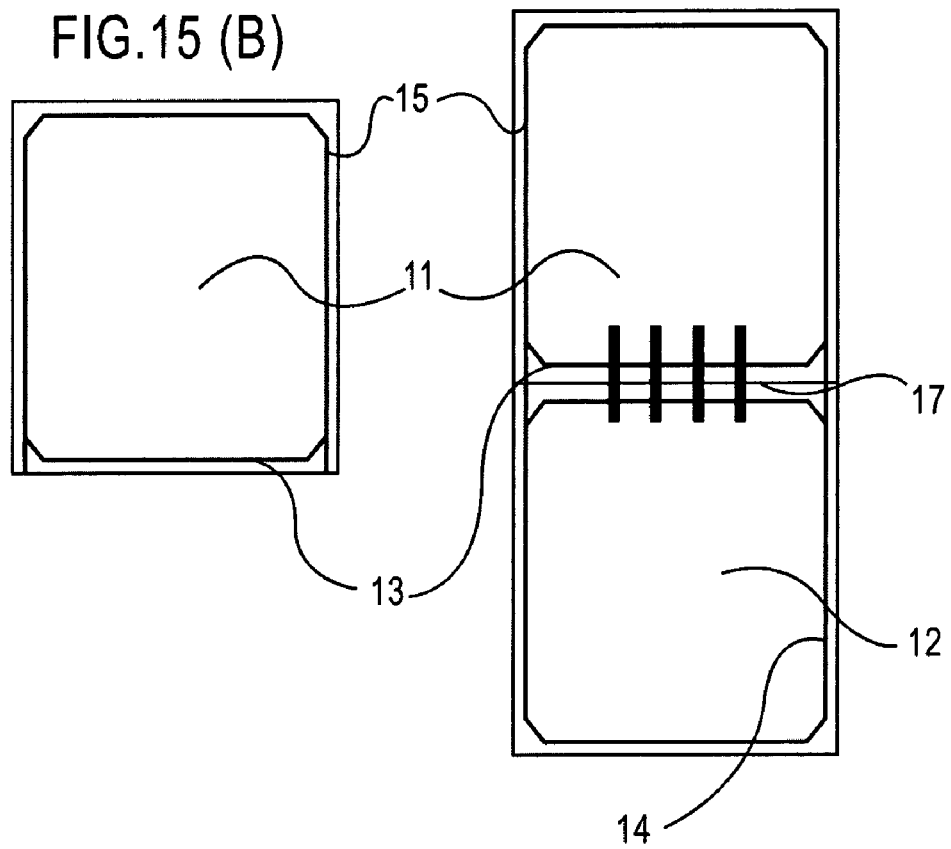

FIG. 15 is a diagram showing a third embodiment of the present invention. In this figure, similar reference numerals to those in the first and second embodiments denote the same elements to avoid duplicate explanation. FIG. 15 discloses the first moisture-proof ring 13 surrounding the first internal circuit, the second moisture-proof ring 14 surrounding the second internal circuit 12, the scribe line 16 provided between the first moisture-proof ring 13 and the second moisture-proof ring 14, and the third moisture-proof ring 15 surrounding the entire part of the first internal circuit 11, second internal circuit 12 and scribe line 16. A part of the third moisture-proof ring 15 is used in common as a part of the first moisture-proof ring 13 and the second moisture-proof ring 14.

In the case of manufacturing the single-core device, the first and second moisture-proof rings are respectively formed continuously surrounding the external circumference of the first internal circuit 11 and the second internal circuit 12.

In the case of manufacturing the multi-core device, the third moisture-proof ring is formed continuously surrounding the region of the first internal circuit 11, second internal circuit 12 and scribe line 16.

In the first and second embodiments, the third moisture-proof ring 15 is allocated in the region outside the first moisture-proof ring 13 and the second moisture-proof ring 14. Therefore, the moisture-proof ring is formed in a wider region, resulting in increase in the chip area. However, in the third embodiment, since a part of the third moisture-proof ring 15 is used in common with a part of the first moisture-proof ring 13 and the second moisture-proof ring 14, the area required for allocating the moisture-proof rings can be suppressed.

Fourth Embodiment

FIGS. 16(A) to 16(C) are diagrams showing a fourth embodiment of the present invention. In these diagrams, similar reference numerals to those in the first embodiment to the third embodiment denote the same elements to avoid duplicate explanation. An example of the multi-core device formed by connecting two chips has been explained in the first to third embodiments, but the multi-core device formed by connecting four chips will be explained in this fourth embodiment.

With reference to FIG. 16(A), the first internal circuit 11, second internal circuit 12, third internal circuit 18 and fourth internal circuit 19 are allocated to form a single multi-core device. A first moisture-proof ring 13, second moisture-proof ring 14, third moisture-proof ring 20, and fourth moisture-proof ring 21 are provided in the external circumference of each of the respective internal circuits. Each moisture-proof ring among the first to fourth moisture-proof rings is provided with the scribe line 16. In addition, a fifth moisture-proof ring 24 is allocated surrounding the entire part of the first to fourth moisture-proof rings and the scribe lines 16.

In the case of manufacturing the single-core device, the fifth moisture-proof ring 24 is divided along the scribe line 16 as shown in FIG. 6(B). Meanwhile, the first moisture-proof ring 13 is formed in the shape of a closed loop to assure moisture-proof protection of the first internal circuit 13. Although, not illustrated in the figure, the second to fourth moisture-proof rings are also formed in the shape of a closed loop to respectively assure the moisture-proof protection of the second to fourth internal circuits.

In the case of manufacturing the multi-core device four chips comprising the four integrated circuits are connected as shown in FIG. 16(C), through an aperture provided to a part of the conductor wall forming the first to fourth moisture-proof rings. A connecting wire 17 for connecting the internal circuits via the apertures is formed similar to the devices of FIG.

10 and FIG. 11. Since the fifth moisture-proof ring 24 is formed in the shape of a loop surrounding the first to fourth moisture-proof rings and each connecting wire 17, moisture-proof protection of the first to fourth internal circuits and each connecting wire 17 can be assured.

It is also a matter of course to adapt the present invention to manufacture of a multi-core device with six or eight chips, in addition to manufacturing a multi-core device with four chips. In short, manufactures of both single-core device and multi-core device can be realized with minimum modifications of reticles by providing a plurality of identical chips to only one reticle and then allocating a plurality of kinds of moisture-proof rings along the scribe lines subjected to the dicing process.

Fifth Embodiment

Figure 17:
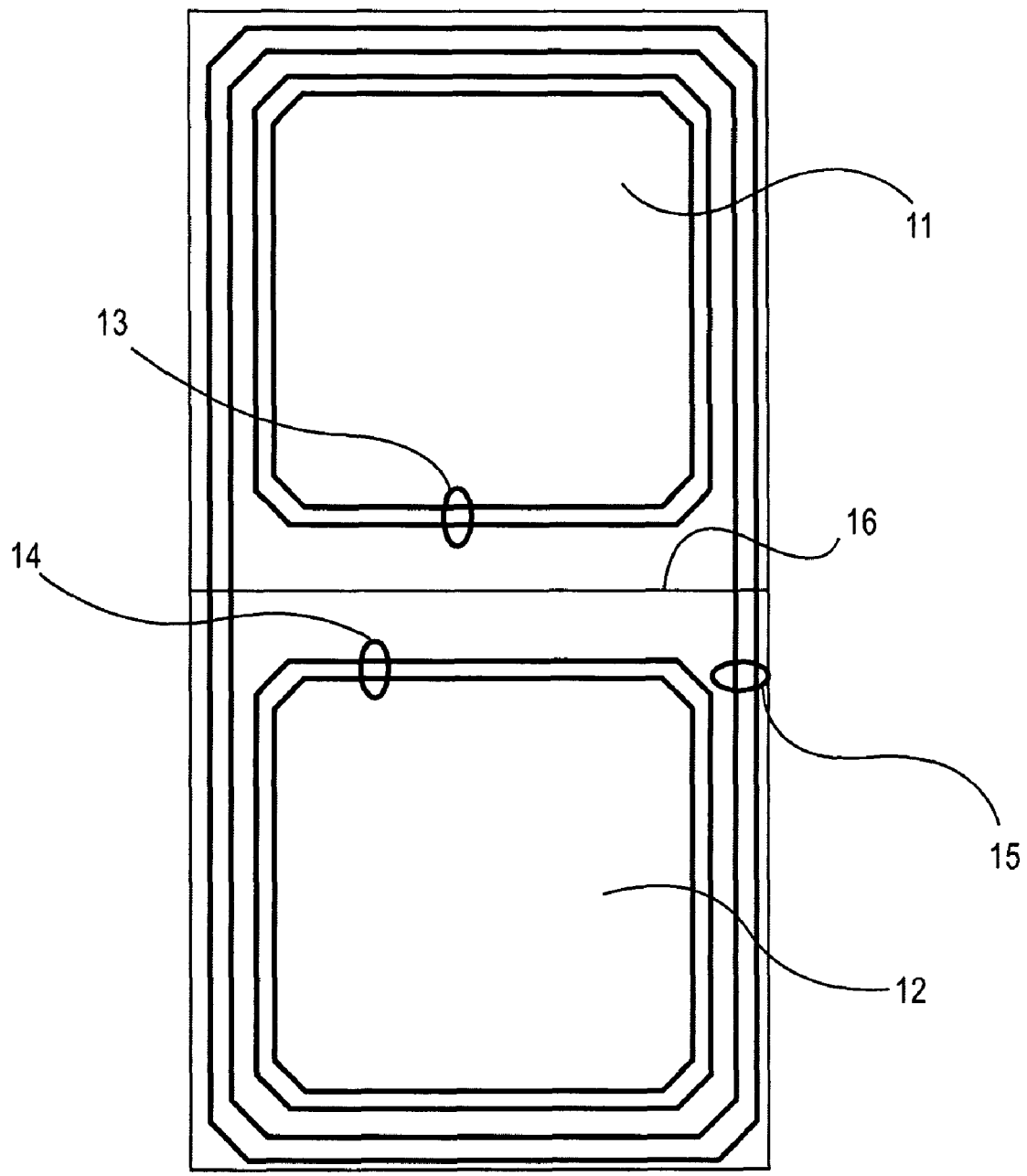
FIG. 17 is a diagram showing the fifth embodiment of the present invention.

FIG. 17 shows a diagram of a fifth embodiment of the present invention. In this figure, the reference numerals similar to those in the first to fourth embodiments designate like elements to avoid duplicate explanation. According to FIG. 17, a first internal circuit 11, second internal circuit 12, and first moisture-proof ring 13 and second moisture-proof ring 14, surrounding respective internal circuits, are formed. The scribe line 16 is provided between the first moisture-proof ring 13 and the second moisture-proof ring 14. Moreover, the third moisture-proof ring 15 is allocated to surround the first internal circuit 11, second internal circuit 12 and scribe line 16.

In FIG. 17, the first to third moisture-proof rings are allocated in double with each comprising an internal side ring and external side ring. The unfavorable moisture-proof characteristic of cracking is improved by providing the moisture-proof rings in a duplicated structure of internal and external sides. Namely, when the dicing process is conducted along the scribe line 16, cracks are commonly generated in the interlayer insulating film in the dicing process. If such a crack reaches inside of the moisture-proof ring, moisture will penetrate the moisture-proof ring through the crack. However, by utilizing the double moisture-proof rings as set forth in the fifth embodiment, cracks generated in the dicing process will not penetrate the double rings and moisture-proof protection is thereby maintained.

Width of the moisture-proof rings formed in the duplicated structure is not required to be identical and such width may be adjusted as required. Moreover, it is not always required to form all of the first to third moisture-proof rings in double. For example, a modification may also be considered by forming in double the first moisture-proof ring 13 and the second moisture-proof ring 14 and forming in single the third moisture-proof ring.

The first to fifth embodiments have been described above and it is also possible to employ the respective embodiments through desirable combination thereof. For example, it is possible to constitute a duplicated structure of the first to fifth moisture-proof rings in the multi-core device formed of four chips by combining the fourth and fifth embodiments. The cross-sectional shape of the moisture-proof ring is not restricted to the shape shown in FIG. 8 or the like and the other shapes, for example, a shape where a plurality of PS1s are formed to LS1, can be employed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device including a plurality of chips comprising:
    a plurality of first moisture-proof rings each including a wall individually surrounding said plurality of chips;
    a second moisture-proof ring surrounding the entire plurality of chips; and
    an interconnection connecting said plurality of chips to each other;
    wherein each of the walls includes a hole penetrating the wall, and the interconnection passes through the hole.

2. The semiconductor device according to claim 1, wherein said plurality of chips each include a pad located within the first moisture-proof ring of each of said chips.

3. A semiconductor device comprising:
    a first internal circuit;
    a second internal circuit adjacent to the first internal circuit;
    a first moisture-proof ring including a first wall surrounding the first internal circuit;
    a second moisture-proof ring including a second wall surrounding the second internal circuit;
    an interconnection connecting the first internal circuit with the second internal circuit; and
    a third moisture-proof ring surrounding the first internal circuit, the second internal circuit, and the wire;
    wherein the first wall includes a first hole penetrating the first wall, the second wall includes a second hole penetrating the second wall, and the interconnection passes through the first hole and the second hole.

4. The semiconductor device according to claim 3 comprising:
    a first pad connected to the first internal circuit;
    a second pad connected to the second internal circuit;
    wherein the first pad is allocated within the first moisture-proof ring, and the second pad is allocated within the second moisture-proof ring.

5. The semiconductor device according to claim 3, wherein any one of the first to third moisture-proof rings includes two moisture-proof rings comprising an external ring surrounding an internal ring.

* * * * *